US007983429B2

(12) United States Patent
Keys

(10) Patent No.: US 7,983,429 B2
(45) Date of Patent: Jul. 19, 2011

(54) SPEAKER SYSTEM UTILIZING INPUT FROM A TRANSDUCER IN PROXIMITY TO A SEPARATE SPEAKER

(76) Inventor: Jeramie J. Keys, Roswell, GA (US)

( * ) Notice: Subject to any disclaimer, the term of this patent is extended or adjusted under 35 U.S.C. 154(b) by 1536 days.

(21) Appl. No.: 11/152,881

(22) Filed: Jun. 15, 2005

(65) Prior Publication Data

US 2006/0285695 A1 Dec. 21, 2006

(51) Int. Cl.

| | |
|---|---|
| ***H04R 3/00*** | (2006.01) |
| ***H04R 29/00*** | (2006.01) |
| ***H04R 1/02*** | (2006.01) |
| ***H04R 5/02*** | (2006.01) |
| ***H04R 5/00*** | (2006.01) |
| ***H04B 1/00*** | (2006.01) |
| ***H03F 99/00*** | (2009.01) |

(52) U.S. Cl. .............. 381/96; 381/59; 381/302; 381/87; 381/120; 381/86; 381/1

(58) Field of Classification Search .................... 381/86, 381/120, 96, 300–309, 56–59, 87, 71.1–71.14, 381/94.1–94.7, 1, 17, 18; 379/406.01–406.09
See application file for complete search history.

(56) References Cited

U.S. PATENT DOCUMENTS 5,613,222 A * 3/1997 Guenther .................. 455/575.2
5,917,920 A * 6/1999 Humphries ..................... 381/86

* cited by examiner

*Primary Examiner* — Devona E Faulk
(74) *Attorney, Agent, or Firm* — Withers & Keys, LLC

(57) ABSTRACT

A speaker system utilizes input from a transducer that receives an acoustical signal produced by a speaker that is separate from the speaker system. The acoustical signal is amplified and drives a speaker of the speaker system. The speaker system is thereby provided with the necessary electrical audio signal without the speaker system being wired into any existing sound system wiring. In automobiles, the transducer is in proximity to a speaker wired into the automobile's audio system, and the transducer obtains the acoustical signal to produce the electrical audio signal used by the speaker of the speaker system so that no access to high or low level electrical audio signals of the audio system of the automobile is necessary. Additionally, the speaker system may employ a power socket plug that is electrically coupled to the power input of the amplifier and that may be plugged into a power socket such as those typical of most vehicles to provide electrical power to the amplifier of the speaker system.

17 Claims, 3 Drawing Sheets

SPEAKER SYSTEM UTILIZING INPUT FROM A TRANSDUCER IN PROXIMITY TO A SEPARATE SPEAKER

TECHNICAL FIELD

The present invention is related to speaker systems that produce sound based on input obtained by a transducer that receives an acoustical signal produced by a separate speaker.

BACKGROUND

Speaker systems convert electrical signals into acoustical signals that are audible. Typically, a speaker system includes a speaker that is driven by an amplifier, where the amplifier receives a low voltage electrical signal and outputs a higher voltage electrical signal to the speaker. The low voltage electrical signal typically comes from a source or head unit that obtains a signal by having a radio frequency tuner that obtains a radio signal and converts the radio signal into the electrical signal or obtains a signal by reading an encoded signal from a medium such as a magnetic tape or an optical disc, e.g., a compact disc.

Providing the electrical signal from the source unit to the amplifier of the speaker system typically involves linking the two with a patch cable that is often coaxial in nature but may be of other forms including twisted pairs. Because the source unit and amplifier may be spaced apart, extending the patch cable between them can be burdensome. This is especially the case when adding a speaker system to a vehicle.

In a vehicle, the source unit is usually at the front while the speaker system being that includes a power amplifier and that is being added to the vehicle is located elsewhere. Positioning the patch cable often involves disassembling the dashboard to access the rear of the source unit where the low voltage level outputs are located and then disassembling additional pieces of the vehicle along the pathway from the source unit to wherever the amplifier is located, such as in a trunk. This is a time consuming and burdensome process.

As an alternative to obtaining a low voltage electrical signal and transferring it to the amplifier via the patch cable, an amplifier with a high voltage level or so-called speaker level input may be used so that the input signal can be obtained by accessing existing wiring leading to existing speakers in the vehicle, or a high-level to low-level converter may be used to provide the signal to a low level input of the amplifier. However, either of these approaches can also be a burdensome task requiring disassembly of covers and panels of the vehicle to access the wiring leading to existing speakers and may also involve splicing into the existing wiring. This is a time consuming and burdensome process as well.

In addition to obtaining the input signal for the amplifier of the speaker system, the amplifier must also be provided with electrical power. Again, in the context of a vehicle, providing electrical power to the amplifier can also be a burdensome task. Generally, electrical power is provided by positioning a power lead from the positive terminal of the battery in the engine compartment to the area where the amplifier is located, such as in the trunk. Much like the patch cable installation, installing the power lead may also require disassembly of portions of the vehicle. This is also a time consuming and burdensome process.

For individuals without the necessary skill, tools, or desire, installing such a speaker system is unrealistic. Instead, such individuals opt for a professional installation if such is affordable or otherwise forego installing the speaker system. The professional installation of the speaker system that includes installing the power lead and patch cable can be time consuming and costly. Furthermore, if the individual wishes to move the speaker system from one vehicle to another location(s), such as from a personal vehicle to a rented vehicle, to a friend's vehicle, to a boat, or to a home, then the time consuming and burdensome process must be repeated for the other location(s).

SUMMARY

Embodiments of the present invention address these issues and others by providing a speaker system that utilizes a transducer to obtain an acoustical signal from a speaker that is separate from the speaker system, such as an existing speaker of a vehicle, and to thereby produce an electrical signal that can be amplified to drive the speaker of the speaker system. Accordingly, no patch cable or accessing of existing speaker wiring is necessary but instead the transducer is placed in proximity to the separate speaker. Additionally, certain embodiments provide for power to the amplifier of the speaker system by utilizing a socket plug placed into the utility electrical power socket of the vehicle.

One embodiment is a system that includes a first speaker that receives a first electrical signal and produces a first acoustical signal. A transducer is in proximity to the first speaker such that the transducer produces a second electrical signal in response to receiving the first acoustical signal. An amplifier amplifies the second electrical signal to produce a third electrical signal, and a second speaker receives the third electrical signal and produces a second acoustical signal.

Another embodiment is a method of generating sound that involves placing a transducer in proximity to a first speaker and generating a first acoustical signal at the first speaker in response to a first electrical signal. The method further involves receiving the first acoustical signal at the transducer to produce a second electrical signal and amplifying the second electrical signal to produce a third electrical signal. Additionally, the method involves receiving the third electrical signal at a second speaker to produce a second acoustical signal.

Another embodiment is a system that includes a transducer in proximity to a first speaker, wherein the first speaker produces a first acoustical signal from a first electrical signal and wherein the transducer produces a second electrical signal in response to receiving the first acoustical signal. The system includes a preamplifier that is electrically connected to the transducer and that amplifies the second electrical signal to produce an intermediate electrical signal. A power amplifier is electrically connected to the preamplifier and amplifies the intermediate electrical signal to produce a third electrical signal, and the power amplifier including a power input. A vehicle power socket plug is electrically connected to the power input, receives electrical power, and provides the electrical power to the power input. A subwoofer receives the third electrical signal and produces a second acoustical signal, and an enclosure to which the subwoofer is mounted.

Another embodiment is a method of installing a speaker system in one or more locations where each of the one or more locations has a first speaker coupled to a head unit and has a power socket. The method involves plugging in a power socket plug into the power socket of a first location, wherein the power socket plug is electrically connected to a power input of an amplifier and provides power from the power socket to the amplifier and wherein the amplifier is electrically coupled to a second speaker of the speaker system. The method further involves placing a transducer in proximity to the first speaker, wherein the transducer is electrically coupled to an audio signal input of the amplifier.

DETAILED DESCRIPTION

Embodiments of the present invention provide for a speaker system that receives an acoustical signal as input rather than an electrical system so that the speaker system does not need to be electrically connected to an audio signal source. The speaker system utilizes a transducer to receive the acoustical signal from a separate speaker and to produce an electrical signal. The electrical signal is then amplified and used to drive a speaker of the speaker system. In this manner the input signal is obtained merely be positioning the transducer in proximity to the separate speaker.

Figure 1:
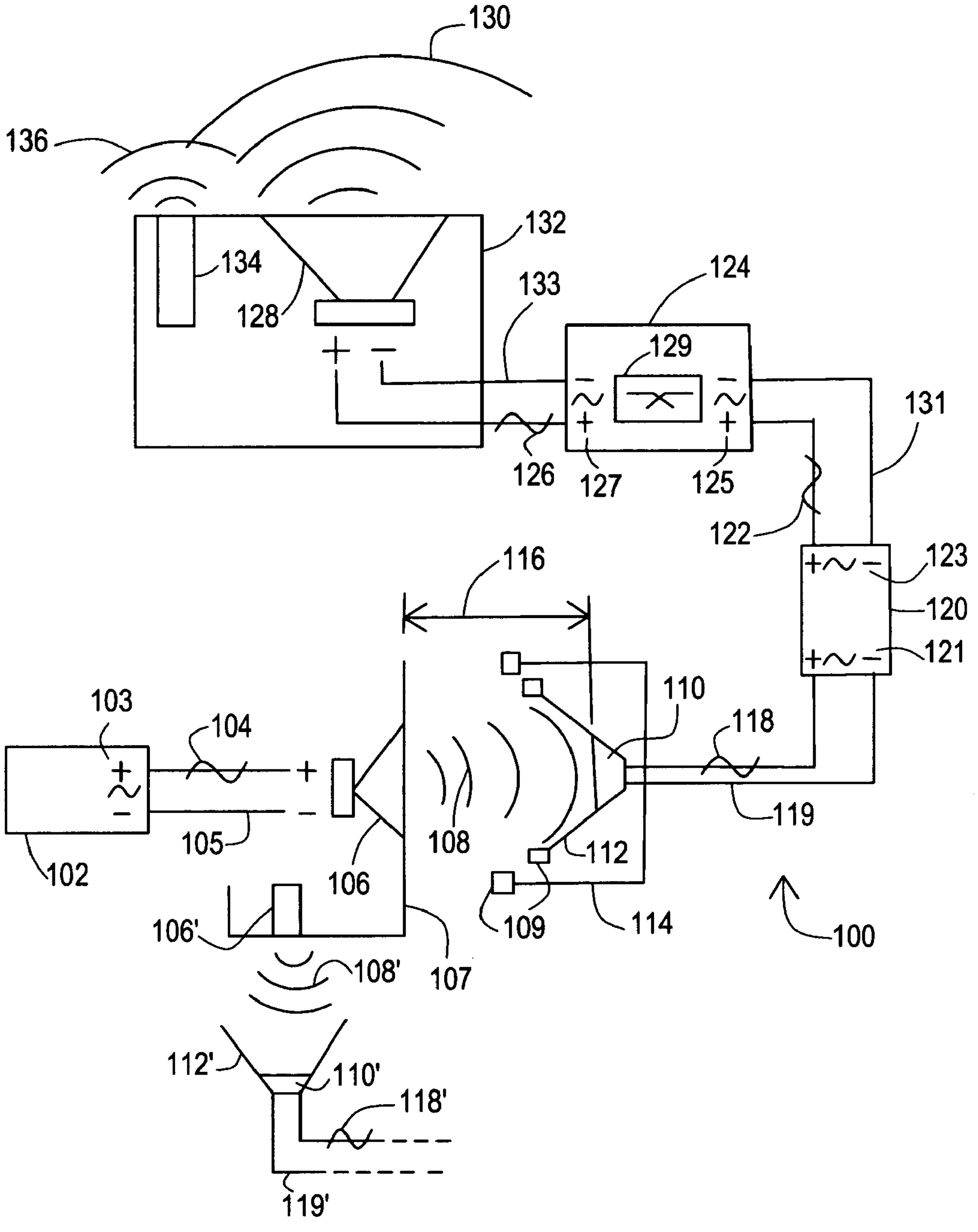
FIG. 1 shows one embodiment of a system including a speaker system that receives input from the acoustical output of a separate speaker.

FIG. 1 shows one example of a system schematic. In this example, the system 100 includes a source or head unit 102 such as a stereo unit of a car. Typically, this head unit 102 has a radio frequency tuner and/or a media reader such as a tape or disc reader so as to produce an electrical audio signal 104 from audio outputs 103. The electrical audio signal 104 travels through a pair of wires 105 to a speaker 106, such as the speaker located in the factory speaker location of the automobile (e.g., in a door panel, dash location, rear shelf location, etc.). In the context of an automobile, the existing speaker 106 is typically mounted to a surface 107 of the interior of the vehicle such as the door panel and the wires 105 are typically discretely routed behind panels and covers of the vehicle.

While FIG. 1 shows one audio output 103 and one speaker 106, it will be appreciated that standard audio systems for which embodiments may be employed typically have at least two audio outputs and two speakers but may have many more. For example, additional audio outputs and speakers may be provided for multi-channel sound such as stereo, front and rear stereo of a vehicle, matrixed surround sound, 5.1 audio, and the like. However, only a single speaker 106 is needed for producing an acoustical signal 108 to be used as the input signal for the embodiment of the speaker system that is being added to supplement any existing speakers.

The acoustical signal 108 that is produced is captured by a transducer 110 of the speaker system. The transducer 110 may be of various forms including unidirectional and omnidirectional microphones. One example of a transducer 110 is an electret condenser such as that found in lapel microphones, which has a small size and usually has an omnidirectional pick-up pattern. Specific examples include the ATR35S lapel microphone from Audio-Technica U.S., Inc., of Stow, Ohio, as well as the 33-3013 Hands-Free Tie-Clip Omnidirectional Electret microphone from RadioShack Corporation of Fort Worth Tex. Such microphones provide a wide frequency response including adequate sensitivity to bass frequencies below 100 Hertz (Hz).

The transducer 110 is positioned in proximity to the speaker 106 such that the transducer 110 receives enough acoustical energy at the frequencies of interest in order to produce an adequate electrical signal capable of amplification to the level necessary to drive an additional speaker. The distance 116 between the transducer 110 and the speaker 106 may vary when attempting to achieve the desired acoustical output of the speaker system and is dependent upon the sensitivity of the transducer 110 and whether a collector 112, 114 is in use, the amount if any of pre-amplification applied to the electrical signal produced by the transducer 110 prior to being amplified by a power amplifier, the gain of the power amplifier, and the sensitivity of the speaker of the speaker system being driven by the power amplifier. The magnitude of the electrical signal produced by the transducer 110 increases as the distance 116 decreases.

To create additional transducer gain prior to any preamplifier stage that may be present, an acoustical collector 112, 114 may be used. The acoustical collector 112, 114 may be of various forms, such as a funnel 112 or a pan or bowl 114. While both the funnel 112 and the pan 114 are shown in conjunction with the one transducer 110 purposes of illustration, one or the other or both may used. The acoustical collector 112, 114 serves to collect the acoustical signal and to assist in focusing the acoustical energy onto the transducer 110 to increase the magnitude of the resulting electrical signal being produced. Additionally, the acoustical collector 112, 114 may serve to isolate the transducer 110 from the acoustical energy of a speaker of the speaker system to thereby reduce the amount of feedback being introduced into the speaker system. Furthermore, the acoustical collector 112, 114 may serve to isolate the transducer 110 from acoustical energy of ambient sounds, such as road noise for a vehicle installation.

To maximize the effects of the acoustical collector 112, 114, attachment mechanisms 109 may be positioned on the acoustical collector 112, 114 so as to fix the acoustical collector 112, 114 to the surface 107 upon which the speaker 106 is mounted and/or to a grill (not shown). When so mounted, the acoustical collector 112, 114 may then completely surround the speaker 106 to isolate it from the ambient. In this manner, a substantially large portion of the acoustical energy from one side of the speaker 106 may be channeled by the acoustical collector 112, 114 to the transducer 110 to increase the overall efficiency of the speaker system. Examples of the attachment mechanisms 109 include self-tapping screws, nut and bolt combinations, double-sided tape, hook and loop fasteners, clips, magnets, and the like.

In some cases, the speaker 106 may be within an enclosure that includes a tuned port 106', vent, passive radiator, or waveguide to reinforce bass production. In such cases, as an alternative to placing the transducer 110, and the collector 112, 114 when present, directly in the path of excitation of the speaker 106, these devices may instead be placed in proximity to the speaker 106 by positioning them in the direct path of excitation of the port 106', vent, passive radiator, or wave guide. Furthermore, in such cases, multiple transducers 110, 110' may be employed to further increase the efficiency of the speaker system whereby one transducer 110 is positioned in the path of excitation of the speaker 106 while another transducer 110' is positioned in the path of excitation of the port, vent, passive radiator, or wave guide.

In the example shown, the transducer 110 and collector 112, 114 are positioned on the front side of the speaker 106. However, these may also be positioned on the rear side of the speaker as an alternative to or in addition to being positioned on the front side. For example, speakers are often mounted in a car with the front of the speaker facing into the car and the rear of the speaker facing into the trunk compartment. In that case, the transducer 110 and collector 112, 114 may be positioned in the trunk to receive the acoustical signal that emanates from the rear of the speaker 106.

The transducer 110 produces an electrical signal 118 on a pair of wires 119. Likewise, when present, transducer 110' produces an electrical signal 118' on a pair of wires 119'. This wire(s) 119, 119' may pass the signal(s) 118, 118' to one or more preamplifiers 120 having a signal input 121 and a signal output 123. The preamplifier 120 typically amplifies the raw signal of the transducer 110 to a level that falls within the typical input voltage range of commercially available power amplifiers. In the two specific examples of transducers 110, the preamplifier stage 120 is built-in and operates upon a small 1.55 Volt button battery. These specific examples provide a maximum output amplitude of about 0.15-0.2 Volts into typical power amplifier input impedances when receiving the acoustical signal output from the speaker 106.

As shown, the preamplifier 120 outputs an electrical signal 122 on wire pairs 131 that extend to an input 125 of a power amplifier 124. However, it will be appreciated that the signal transfer from the preamplifier 120 to the power amplifier 124 may be other than entirely wire-based such as where the wire run would otherwise be lengthy from the speaker 106 to the power amplifier 124. For example, wireless lapel microphones may be utilized where the preamplifier 120 feeds the electrical signal to a radio transmitter (not shown) that produces a modulated radio signal and a radio receiver (not shown) receives the and demodulates the radio signal to produce an electrical signal that is then preamplified and provided to the low voltage inputs 125 of the power amplifier 124.

The power amplifier amplifies the electrical signal to a level that is capable of driving a speaker of the speaker system to a substantial volume. For example, the power amplifier may range from 10 watts into a 4 ohm load up to thousands of watts, depending upon the power handling of the speaker(s) being driven. Such power amplifiers 124 are readily available and accept low voltage level signals that are on the order of 0.2 Volts such as those from the preamplifier of the lapel microphones discussed above. While a single power amplifier 124 is shown for purposes of illustration, it will be appreciated that the speaker system may include any number of power amplifiers 124 as dictated by the number of speakers to be driven and their respective power handling.

In addition to amplifying the electrical signal 122 from the preamplifier, the power amplifier 124 may also include a built-in filter 129, such as a low pass filter, a high pass filter, a bandpass filter, and/or a subsonic filter. This filter 129 may be used to control the amplitude of frequencies present on an electrical signal 126 provided from an output 127 on wires 133. For example, where the speaker system includes only a subwoofer, the filter 129 may be a low pass filter having a slope of from 12 dB/octave to 18 dB/octave and may be set to a cutoff frequency in the high-bass to mid-bass region of around 80-100 Hz. In addition to preventing unwanted high frequencies obtained from the original signal 104, the low pass filtering may also reduce unwanted high-frequency oscillations due to feedback associated with the transducer 110 not being adequately isolated from the speaker being driven by the power amplifier 124.

The electrical signal 126 is fed to a speaker 128 of the speaker system via the pair of wires 133. It will be appreciated that as an alternative to or in addition to the filter 129, passive filtering components including inductors and capacitors may be placed in-line between the amplifier 124 and the speaker 128 to further filter the frequencies reaching the speaker 128. While one speaker 128 is shown for purposes of illustration, it will be appreciated that any number of speakers 128 may be utilized in combination with the any number of power amplifiers 124. The speaker 128 may be of various forms of commercially available loudspeakers, including a tweeter, midrange driver, woofer, subwoofer, or any combination thereof having an impedance compatible with the output 127 of the power amplifier 124. The speaker 128 produces an acoustical signal 130 to compensate for and/or to complement the acoustical signal 108 of the speaker 106 or any other speakers being driven by the head unit 102.

Where the speaker 128 is required to produce bass frequencies, the speaker 128 may be mounted to a baffle or enclosure 132 to isolate the acoustical wave of the front of the speaker 128 from the acoustical wave of the rear to avoid cancellation. Furthermore, the enclosure 132, when present, may be an acoustic suspension enclosure, an enclosure with a tuned port 134, a vent (not shown), a passive radiator (not shown), or a waveguide (not shown), one of several varieties of bandpass enclosures, an isobaric enclosure where multiple speakers are present, or a combination thereof. In the case of a tuned port 134 or other reinforcing feature, an acoustical signal 136 resulting from the acoustic wave of the rear of the speaker 128 is also output from the enclosure 132. Such as enclosure 132 may be of various forms such as ordinarily shaped boxes, tubes, etc.

In order for the speaker system to preamplify and amplify the signal obtained by the transducer in proximity to the speaker that is hard-wired to the head unit, the preamplifier and the power amplifier must receive electrical power. Ordinarily in the context of a vehicle, electrical power is provided by providing a dedicated power wire that extends from the positive terminal of a battery of the vehicle in the engine compartment to the location where the amplifier is positioned. The amplifier 124, preamplifier 120, and other powered devices of FIG. 1 may receive power in this ordinary manner. However, FIG. 2 shows a schematic of one embodiment of a system 200 that illustrates an alternative manner that electrical power may be obtained in the context of a vehicle.

Figure 2:
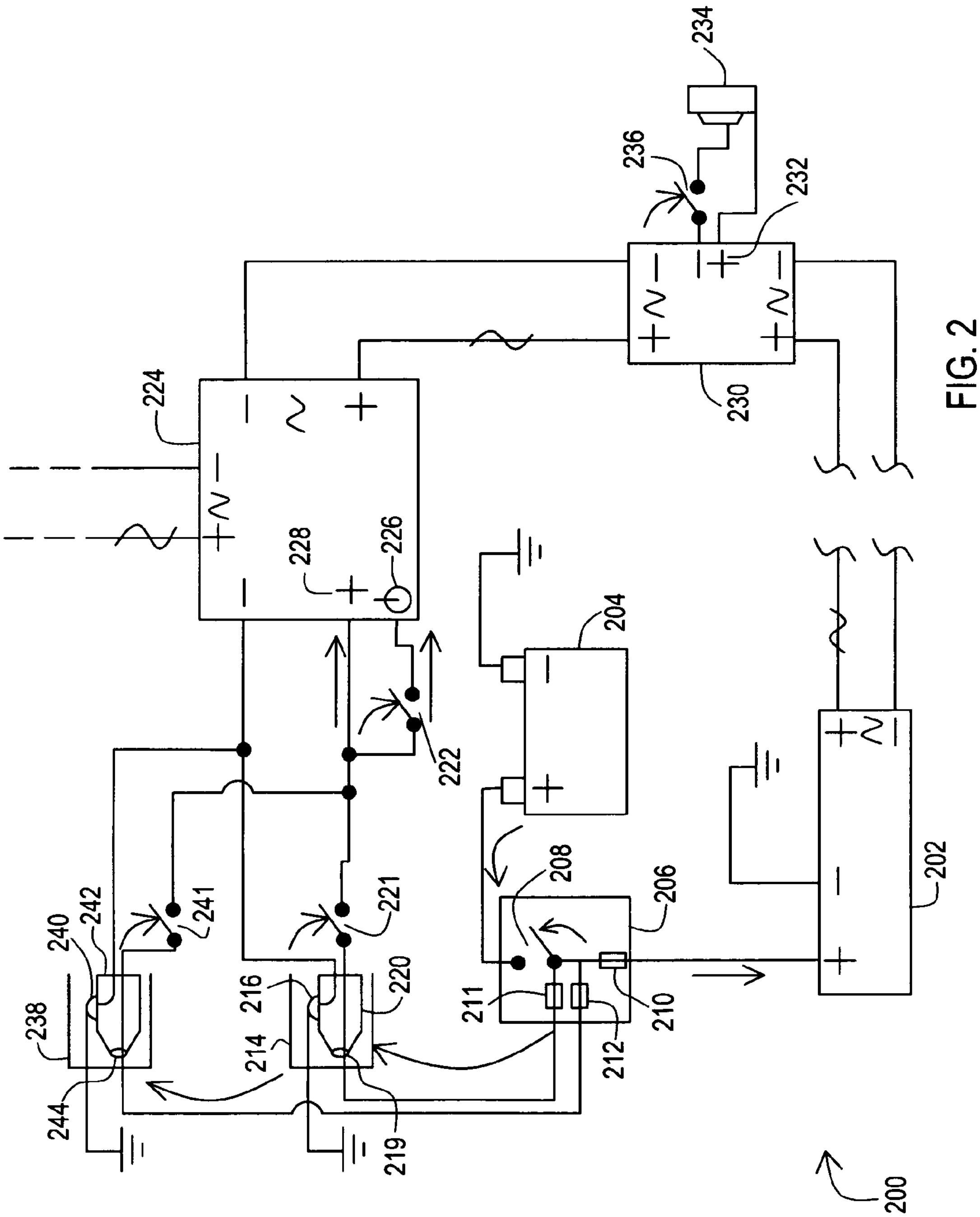
FIG. 2 shows one embodiment of a system where a power amplifier receives electrical power via a utility power socket of a vehicle.

In FIG. 2, a battery 204 or other power source is present in the vehicle. The battery 204 of this example is connected so as to establish a negative ground system whereby the negative side is connected to chassis ground while the positive side is connected to a fuse block 206. Typically, such batteries are included in the engine compartment and are designed to output approximately 12 Volts when the engine is not running, and the positive terminal of the battery typically achieves a higher potential, such as 13 or 14 Volts, when the engine is running due to the charging system of the vehicle providing the higher. Power to various circuits stemming from the fuse block 206 may be switched on and off from the battery 204 and charging system of the vehicle by a switch 208, such as the ignition switch of the vehicle. Each of the circuits shown include a fuse 210, 211, 212 to protect each circuit from overcurrent conditions such as short circuits to ground or loads that have a resistance that is too low.

As shown, a head unit 202 receives power from the fuse block 206 and is protected by fuse 210. The head unit 202 may provide an output to a preamplifier 230, such as by producing an acoustical signal via a speaker where the acoustical signature is collected by a transducer that is electrically coupled to the preamplifier 230 as discussed above in relation to FIG. 1. The preamplifier 230 requires electrical power through an input 232. The electrical power may be provided in various manners, such as by utilizing a DC-DC converter that receives electrical power that stems from the battery 204 and converts this electrical power to a voltage suitable for the input 232, such as 1.55 Volts for the lapel microphones discussed above. As an alternative, the preamplifier 230 may utilize a battery 234, such as a button battery (e.g., model LR44), to provide electrical power to input 232. A switch 236 may be included to allow the electrical power to be switched on and off to the input 232.

The fuse block 206 of most vehicles also provides electrical power to one or more power sockets 214 and 238. These power sockets 214 and 238 typically carry up to 10 Amperes each and support such devices as a cigarette lighter, a DC to AC inverter, and various other automobile accessories. The socket 214 includes a positive electrode that is connected to the fuse block 206 and is protected by fuse 211 and includes a negative electrode that is connected to chassis ground. Likewise, the additional socket 238, when present, includes a positive electrode that is connected to the fuse block 206 and is protected by fuse 212 and includes a negative electrode that is connected to chassis ground. These power sockets 214, 238 may be connected within the fuse block 206 on either side of the switch 208. As shown, the power sockets 214, 238 are connected so that they acquire voltage from the fuse block 206 only upon the switch 208 being closed. In the alternative, these power sockets 214, 238 may be connected within the fuse block 206 on the other side of the switch 208 so that these power sockets 218, 238 acquire voltage at all times regardless of the position of the switch 208.

To provide electrical power from the battery 204 and/or charging system of the vehicle to the power amplifier 224 that is receiving electrical signals from the amplifier 230 in order to drive the speaker of the speaker system, the power amplifier 224 includes power input 228 including positive and negative connections and may also include a remote turn on connection 226. The electrical power is received via the power input 228, and the amplifier is turned on and off by voltage or lack thereof applied to the remote turn on connection 226. To further aid in providing power to the amplifier, the power input 228 may have a stiffening capacitor (not shown) wired in parallel relative to the output form the power sockets 214, 238.

The remote turn on connection may be connected to a remote turn on lead of head unit 202, but to avoid having to access the remote turn on lead, the remote turn on connection 226 may be connected to a positive terminal, such as in parallel with the positive side of the power input 228. A switch 222 may be included between the remote turn on connection 226 and the power lead so that the power amplifier may be switched on and off manually. As an alternative, the power amplifier 224 may be provided with auto-sensing inputs so that when an electrical signal that is to be amplified is present, the amplifier detects the electrical signal and switches on automatically.

The power input 228 may receive electrical power through leads having at least one power socket plug 220, 242, such as the model 170-1559 by Radio Shack Corp., at the end opposite the power input 228. The power socket plug 220, 242 is a mate to the power socket 214, 238 and essentially plugs into the power socket to receive electrical power from it. The number of power socket plugs 220, 242 that are in use in parallel with the power input 228 may be dictated by the amount of current necessary for the power amplifier 224 at the given input voltage relative to the amount of current that may be provided through each of the power sockets 214, 238. So, for example, if an amplifier 224 only requires about 10 Amperes for 12 Volt power to reach an output signal magnitude that is desired and each power socket 214, 238 provides 10 Amperes, then only a single power socket plug 220 mated to a the power socket 214 may be used. However, if the amplifier requires more than 10 Amperes but no more than 20 Amperes, then both power socket plugs 220, 242 may be mated with both power sockets 214, 238 as shown in FIG. 2. It may be desirable to include diodes (not shown) in-line between the power socket plugs 220, 242 and the point where the plugs 220, 242 are joined at a common node so as to avoid harm to the electrical system of the vehicle and to also avoid unintended effects, such as one power socket having excess current draw due to feeding power into another power socket that may be providing less voltage or such as oscillation due to the power sockets having counteracting voltages that rise and fall.

To obtain electrical power, power socket plug 220 includes a positive electrode tip 219 and a negative electrode 216 that mate with the positive and negative electrodes, respectively, of the power socket 214. Likewise, power socket plug 242 includes a positive electrode tip 244 and a negative electrode 240 that mate with the positive and negative electrodes, respectively, of the power socket 238. Additionally, these power socket plugs 220, 242 may include a switch 221, 241 that allows power to the amplifier 224 to be manually controlled.

Figure 3:
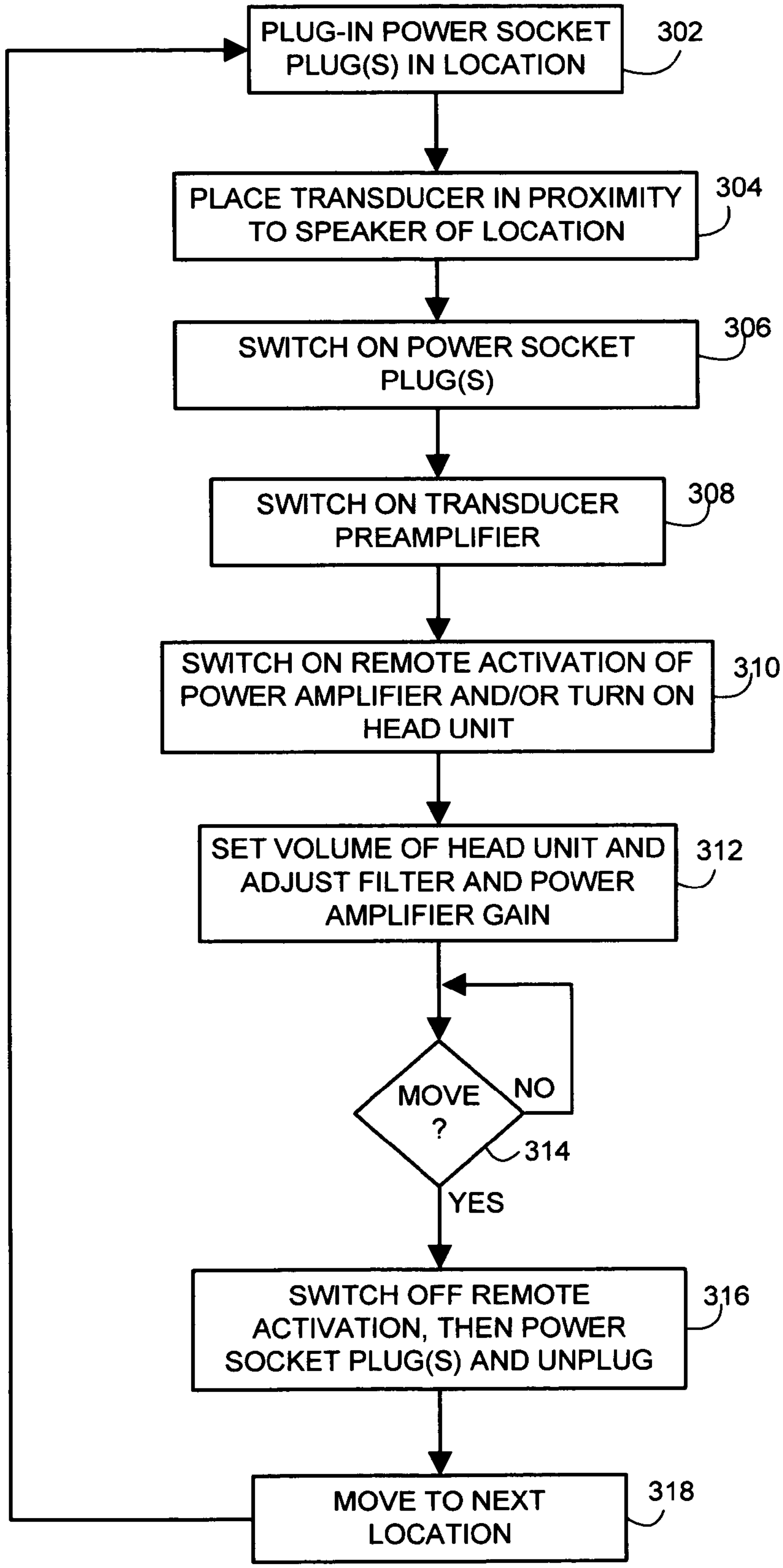
FIG. 3 shows one embodiment of operations employed to install a speaker system in one location such as a first vehicle and then move the speaker system to another location such as a second vehicle.

FIG. 3 shows on example of a set of steps used to install the speaker system such as that shown in FIGS. 1 and 2 in a first location, such as a first vehicle, and then move the speaker system to a second location, such as a second vehicle. It will be appreciated that the steps and the particular order in which they are presented is for purposes of illustration only, and that the steps involved and their particular orders may be changed in order to install and move the speaker system between locations. The steps begin at socket operation 302 by plugging in the power socket plug(s) into the power socket(s) of the first location. Then, the transducer is placed in proximity to the speaker of the first location at transducer operation 304. At this point, the speaker system is ready to operate and only needs to be powered up for embodiments that include switches on the power leads and/or where the power socket(s) are activated by the ignition switch of a vehicle serving as the first location.

The power socket plug(s) are switched on, such as by manipulating the switch built-in for each power socket plug and/or by manipulating the ignition switch of the vehicle serving as the first location at switch operation 306. Then, the switched preamplifier for the transducer, when present, is switched on at switch operation 308. It will be appreciated that the order may also be reversed such that the preamplifier is switched on prior to switching on the power socket plugs, and this reversed order may be useful where there is no remote turn on control for the amplifier other than controlling power from the power socket plug in order to reduce the so-called turn on thump of the amplifier.

Where there is a remote turn on control for the amplifier, then the remote activation of the amplifier may occur at switch operation 310 by switching on the remote turn on control if present, and/or switching on the head unit. Switching on the head unit may itself cause the remote turn on of the amplifier such as where the remote turn on lead has been connected to the remote turn on input of the amplifier or where the amplifier has auto-sensing inputs that turn on the amplifier when signal is present. At this point, the speaker system is operative and produces acoustical signals from the speaker of the speaker system in response to acoustical signals being obtained from the separate speaker.

In order to fine tune the operation of the speaker system, the volume of the head unit may be set as desired and then the filter and gain of the power amplifier may be adjusted at tune operation 312. Here, the settings that produce desirable acoustical signals from the speaker system in terms of frequencies and volume are found by trial and error. The speaker system may then be used as desired within the first location.

Query operation 314 represents an individual deciding whether to move the speaker system to a second location, such as a second vehicle, a boat, an indoor location, etc. If the individual does decide to move the speaker system, then the remote activation is switched off and then the power socket plugs are switched off and unplugged at switch operation 316. After switching off and unplugging the power socket plugs, the speaker system is then moved to the second location at move operation 318, which includes removing the transducer from the proximity of the separate speaker of the first location. Once the speaker system has been moved to the second location, the steps return to socket operation 302 and proceed as described above.

While the invention has been particularly shown and described with reference to various embodiments thereof, it will be understood by those skilled in the art that various other changes in the form and details may be made therein without departing from the spirit and scope of the invention.

What is claimed is:

1. A system, comprising:

a transducer in proximity to a first speaker mounted to a surface such that the transducer produces a second electrical signal in response to receiving a first acoustical signal corresponding to a first electrical signal from the first speaker;

an amplifier that amplifies the second electrical signal to produce a third electrical signal;

a second speaker that receives the third electrical signal and that produces a second acoustical signal; and an acoustical collector surrounding the transducer such that the first acoustical signal is substantially captured within the acoustical collector and directed to the transducer and such that the transducer is isolated from ambient acoustical signals;

wherein the acoustical collector comprises an opening and an attachment mechanism disposed on a surface of the acoustical collector at the opening; and wherein the attachment mechanism affixes the acoustic collector to said surface upon which said first speaker is mounted.

2. The system of claim 1, wherein the first speaker is a full-range driver and wherein the second speaker is a subwoofer.

3. The system of claim 1, further comprising an enclosure and wherein the second speaker is mounted to the enclosure.

4. The system of claim 3, wherein the enclosure includes a port.

5. The system of claim 1, wherein the transducer is an electret condenser.

6. The system of claim 1, wherein the amplifier includes a power input, the speaker system further comprising:

a vehicle power socket plug electrically connected to the power input.

7. The system of claim 6, wherein the vehicle power socket plug is inserted into a vehicle power socket and wherein electrical power is received into the vehicle power socket plug from the vehicle power socket and is received into the power input from the vehicle power socket plug.

8. The system of claim 1, wherein the amplifier comprises:

a preamplifier that receives and amplifies the second electrical signal to produce an intermediate electrical signal; and a power amplifier that receives and amplifies the intermediate electrical signal to produce the third electrical signal.

9. A method of generating sound, comprising:

placing a transducer in proximity to a first speaker mounted to a surface;

generating a first acoustical signal at the first speaker in response to a first electrical signal;

receiving the first acoustical signal at the transducer to produce a second electrical signal;

amplifying the second electrical signal to produce a third electrical signal;

receiving the third electrical signal at a second speaker to produce a second acoustical signal; and enclosing the transducer relative to the first speaker via an acoustical collector such that the acoustical collector isolates the transducer from ambient acoustical signals;

wherein the acoustical collector comprises an opening and an attachment mechanism disposed on a surface of the acoustical collector at the opening; and wherein the attachment mechanism affixes the acoustic collector to said surface upon which said first speaker is mounted.

10. The method of claim 9, wherein the second speaker is a subwoofer and wherein amplifying the second electrical signal to produce the third electrical signal further comprises applying a low pass filter to attenuate frequencies above a cutoff within the third electrical signal.

11. The method of claim 10, further comprising providing an enclosure for the subwoofer.

12. The method of claim 9, wherein amplifying the second electrical signal comprises applying pre-amplification to produce an intermediate electrical signal and then applying power amplification to the intermediate electrical signal to produce the third electrical signal.

13. The method of claim 9, further comprising:

receiving electrical power for amplifying the second electrical signal through a vehicle power socket plug inserted into a vehicle power socket.

14. A system, comprising:

a transducer in proximity to a first speaker mounted to a surface, wherein the first speaker produces a first acoustical signal from a first electrical signal and wherein the transducer produces a second electrical signal in response to receiving the first acoustical signal;

an acoustical collector surrounding the transducer such that the first acoustical signal is substantially captured within the acoustical collector and directed to the transducer and such that the acoustical collector isolates the transducer from ambient acoustical signals, wherein the acoustical collector comprises an opening and an attachment mechanism disposed on a surface of the acoustical collector at the opening and wherein the attachment mechanism affixes the acoustic collector to said surface upon which said first speaker is mounted;

a preamplifier that is electrically connected to the transducer and that amplifies the second electrical signal to produce an intermediate electrical signal for outputting to a power amplifier; and a vehicle power socket plug that receives electrical power and provides the electrical power to a power input of the power amplifier.

15. The system of claim 14, further comprising a switch within the vehicle power socket plug to switch on power from the vehicle power socket plug to the power input.

16. The system of claim 15, wherein the power amplifier includes a remote activation input, the speaker system further comprising a switch between the vehicle power socket plug and the remote activation input to switch on power to the remote activation input independently of switching on power to the power input.

17. The system of claim 16, further comprising:

the power amplifier that is electrically connected to the preamplifier and that amplifies the intermediate electrical signal to produce a third electrical signal, the power amplifier including the power input;

a subwoofer that receives the third electrical signal and produces a second acoustical signal; and an enclosure to which the subwoofer is mounted.

* * * * *